US 11,495,637 B2

(12) United States Patent
Hsu et al.

(10) Patent No.: US 11,495,637 B2
(45) Date of Patent: Nov. 8, 2022

(54) RESISTIVE RANDOM ACCESS MEMORY AND METHOD OF MANUFACTURING THE SAME

(71) Applicant: Winbond Electronics Corp., Taichung (TW)

(72) Inventors: Po-Yen Hsu, Taichung (TW); Shih-Ning Tsai, Taichung (TW); Bo-Lun Wu, Taichung (TW); Tse-Mian Kuo, Taichung (TW)

(73) Assignee: Winbond Electronics Corp., Taichung (TW)

( * ) Notice: Subject to any disclaimer, the term of this patent is extended or adjusted under 35 U.S.C. 154(b) by 286 days.

(21) Appl. No.: 16/919,047

(22) Filed: Jul. 1, 2020

(65) Prior Publication Data
US 2022/0005868 A1  Jan. 6, 2022

(51) Int. Cl.
*H01L 27/24* (2006.01)
*G11C 7/18* (2006.01)
*H01L 45/00* (2006.01)

(52) U.S. Cl.
CPC .......... *H01L 27/24* (2013.01); *G11C 7/18* (2013.01); *H01L 45/1233* (2013.01); *H01L 45/1253* (2013.01); *H01L 45/1608* (2013.01)

(58) Field of Classification Search
CPC . H01L 27/24; H01L 45/1233; H01L 45/1253; H01L 45/1608; H01L 45/08; H01L 45/1266; H01L 45/146; H01L 27/2436
See application file for complete search history.

(56) References Cited

U.S. PATENT DOCUMENTS

| | | | |
|---|---|---|---|
| 9,876,054 B1 | 1/2018 | Apodaca et al. | |
| 2009/0072215 A1 | 3/2009 | Lung et al. | |
| 2011/0193048 A1 | 8/2011 | Oh et al. | |
| 2012/0104352 A1 | 5/2012 | Aoyama et al. | |
| 2013/0112935 A1* | 5/2013 | Himeno | H01L 45/146 257/4 |
| 2013/0126812 A1 | 5/2013 | Redaelli et al. | |
| 2014/0353568 A1 | 12/2014 | Boniardi et al. | |
| 2015/0364681 A1* | 12/2015 | Murase | H01L 45/146 257/4 |
| 2015/0372060 A1 | 12/2015 | Terai et al. | |
| 2016/0141496 A1 | 5/2016 | Park et al. | |

OTHER PUBLICATIONS

Office Action of Taiwan Counterpart Application, dated Mar. 16, 2021, pp. 1-4.

* cited by examiner

*Primary Examiner* — Allison Bernstein
(74) *Attorney, Agent, or Firm* — JCIPRNET (57) ABSTRACT

Provided are a resistive random access memory and a method of manufacturing the same. The resistive random access memory includes a stacked structure and a bit line structure. The stacked structure is disposed on a substrate. The stacked structure includes a bottom electrode, a top electrode and a resistance-switching layer. The bottom electrode is disposed on the substrate. The top electrode is disposed on the bottom electrode. The resistance-switching layer is disposed between the bottom electrode and the top electrode. The bit line structure covers a top surface of the stacked structure and covers a portion of a sidewall of the stacked structure. The bit line structure is electrically connected to the stacked structure.

19 Claims, 7 Drawing Sheets

RESISTIVE RANDOM ACCESS MEMORY AND METHOD OF MANUFACTURING THE SAME

TECHNICAL FIELD

The invention relates to a non-volatile memory and a method of manufacturing the same, and more particularly, relates to a resistive random access memory and a method of manufacturing the same.

BACKGROUND

With the advantages of simple structure, small area, small operating voltage, fast operating speed, long memory time, multi-state memory and low power consumption, a resistive random access memory (RRAM) has gradually become a kind of trend.

In general, any structure existing in the resistive random access memory will affect its resistance value and electrical performance. Therefore, how to design a resistive random access memory that can provide better electrical performance during operation becomes a very important subject in the field.

SUMMARY

The invention is directed to a resistive random access memory and a method of manufacturing the same, which can provide better electrical performance during operation and can meet the trend of miniaturization.

The invention provides a resistive random access memory including a stacked structure and a bit line structure. The stacked structure is disposed on the substrate. The stacked structure includes a bottom electrode, a top electrode and a resistance-switching layer. The bottom electrode is disposed on the substrate. The top electrode is disposed on the bottom electrode. The resistance-switching layer is disposed between the bottom electrode and the top electrode. The bit line structure covers a top surface of the stacked structure and covers a portion of a sidewall of the stacked structure. The bit line structure is electrically connected to the stacked structure.

The invention provides a method of manufacturing a resistive random access memory which at least includes the following steps. A stacked structure is formed on a substrate, wherein the stacked structure includes a bottom electrode, a resistance-switching layer and a top electrode formed in that sequence. An insulation layer is formed on the substrate, and the insulation layer has an opening. A dielectric material is formed in the opening. A portion of the insulation layer and the dielectric material are removed to form a trench on the stacked structure, wherein the trench exposes a top surface of the stacked structure and a portion of a sidewall of the stacked structure. A bit line structure is formed in the trench, wherein the bit line structure is electrically connected to the stacked structure.

Based on the above, because the bit line structure of the resistive random access memory of the invention covers the top surface of the stacked structure and covers the portion of the sidewall of the stacked structure, an area of an electrical connection between the bit line structure and the top electrode can be increased so that the bit line structure and the top electrode are in direct contact to increase a contact window. Accordingly, the additional resistance value formed between the bit line structure and the top electrode by using other components is eliminated, so that better electrical performance can be effectively obtained during operation while meeting the trend of miniaturization.

To make the aforementioned more comprehensible, several embodiments accompanied with drawings are described in detail as follows

DETAILED DESCRIPTION

The invention will be described more comprehensively below with reference to the drawings for the embodiments. However, the invention may also be implemented in different forms rather than being limited by the embodiments described in the invention. Thicknesses of layer and region in the drawings are enlarged for clarity. The same reference numbers are used in the drawings and the description to indicate the same or like parts, which are not repeated in the following embodiments.

Figure 1A:
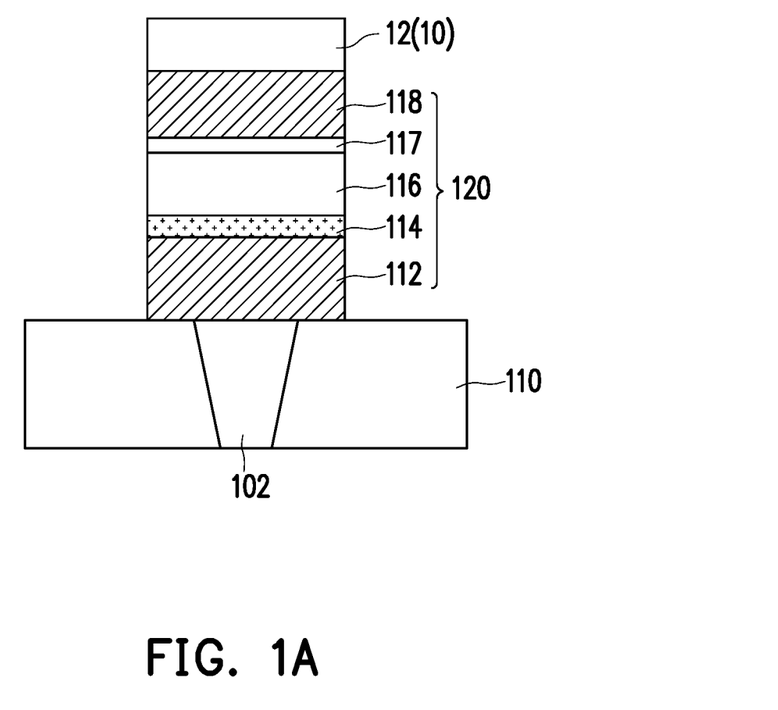
FIG. 1A to FIG. 1G are schematic cross-sectional views of a manufacturing process of a resistive random access memory according to an embodiment of the invention.

FIG. 1A to FIG. 1G are schematic cross-sectional views of a manufacturing process of a resistive random access memory according to an embodiment of the invention. Referring to FIG. 1A, this embodiment provides a method of manufacturing a resistive random access memory 100, which includes the following steps. First, a substrate 110 is provided. The substrate 110 is, for example, a silicon substrate.

Next, a bottom electrode 112 is formed on the substrate 110. A material of the bottom electrode 112 is, for example, titanium nitride (TiN) or indium tin oxide (ITO). A forming method of the bottom electrode 112 is, for example, physical vapor deposition (PVD) or atomic layer deposition (ALD), but the invention is not limited thereto. In an embodiment, the bottom electrode 112 is electrically connected to a drain region of a transistor (not shown) through a plug 102 in the substrate 110, for example.

After the top electrode 112 is formed, a resistance-switching layer 114 is formed on the bottom electrode 112. Here, the resistance-switching layer 114 may be, for example, a film layer whose resistance value can be adjusted by the change of the electric field so that the on/off state (SET and RESET) in the resistance random access memory 100 can be adjusted. Moreover, a material of the resistance-switching layer 114 may be a material whose crystalline state does not change due to heat. For instance, a material of the variable resistance layer 114 may be a transition metal oxide, such as hafnium oxide ($HfO_2$), tantalum oxide ($Ta_2O_5$), or other suitable metal oxides. A forming method of the resistance-switching layer 114 is, for example, physical vapor deposition or atomic layer deposition, but the invention is not limited thereto.

After the resistance-switching layer 114 is formed, an oxygen exchanging layer 116 is formed on the resistance-switching layer 114. A material of the oxygen exchanging layer 116 is, for example, titanium, tantalum, hafnium, zirconium, platinum, or aluminum. A forming method of the oxygen exchanging layer 116 is, for example, physical vapor deposition or atomic layer deposition, but the invention is not limited thereto.

After the oxygen exchanging layer 116 is formed, a top electrode 118 is formed on the oxygen exchanging layer 116. A material of the top electrode 118 is, for example, titanium nitride or indium tin oxide. A forming method of the top electrode 118 is, for example, physical vapor deposition or atomic layer deposition. Further, as shown in FIG. 1A, the bottom electrode 112, the resistance-switching layer 114, the oxygen exchanging layer 116, and the top electrode 118 may constitute a stacked structure 120. For instance, the configuration relationship in the stacked structure 120 may be described as follows. The top electrode 118 is disposed on the bottom electrode 112. The resistance-switching layer 114 is disposed between the bottom electrode 112 and the top electrode 118. The oxygen exchanging layer 116 is disposed between the resistance-switching layer 114 and the top electrode 118.

In addition, in order to prevent current dispersion to increase current density and thereby improve a high-temperature data retention capability, an oxygen-rich layer 117 may be selectively formed between the oxygen exchanging layer 116 and the top electrode 118. That is to say, the oxygen-rich layer 117 may be further included in the stacked structure 120. A material of the oxygen-rich layer 117 is, for example, alumina. A forming method of the oxygen-rich layer 117 is, for example, physical vapor deposition or atomic layer deposition. However, the invention is not limited in this regard. In the embodiment not shown, it is also possible that the oxygen-rich layer 117 is not formed between the oxygen exchanging layer 116 and the top electrode 118.

Figure 1B:
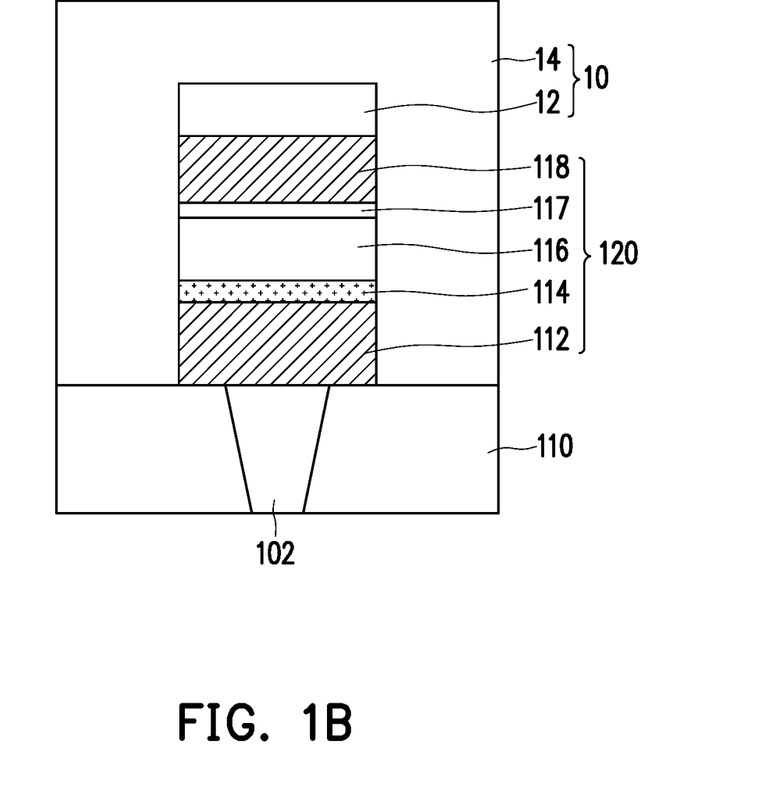

Referring to FIG. 1A and FIG. 1B together, after the stacked structure 120 is formed, an insulation material 10 may be formed on the substrate 110. Here, the insulation material 10 may encapsulate the stacked structure 120. In this embodiment, the insulation material 10 may be formed by the following steps. First, as shown in FIG. 1A, a first insulation material 12 may be formed on the substrate 110. Here, the first insulation material 12 is stacked on the stacked structure 120. The first insulation material 12 is formed only on the top electrode 118 of the stacked structure 120, for example. First, as shown in FIG. 1B, a second insulation material 14 may be formed on the substrate 110. The second insulation material 14 is, for example, fully formed on the substrate 110 to encapsulate the stacked structure 120 and the first insulation material 12. In an embodiment, a portion of the second insulation material 14 may be in direct contact with the substrate 110, but the invention is not limited thereto.

In this embodiment, for example, the stacked structure 120 and the first insulation material stacked thereon may be formed by the following steps. First, a bottom electrode material, a resistance-switching layer material, an oxygen exchanging layer material, an oxygen-rich layer material, a top electrode material, and the first insulation material can be comprehensively formed on the substrate 110 in that sequence. Next, a patterning process (lithography etching process) is performed on the foregoing materials to form the stacked structure 120 and the first insulation material 12 stacked thereon with a portion of the substrate 110 exposed. However, the invention is not limited in this regard. The stacked structure 120 and the first insulation material 12 may be formed by other suitable methods.

Figure 1C:
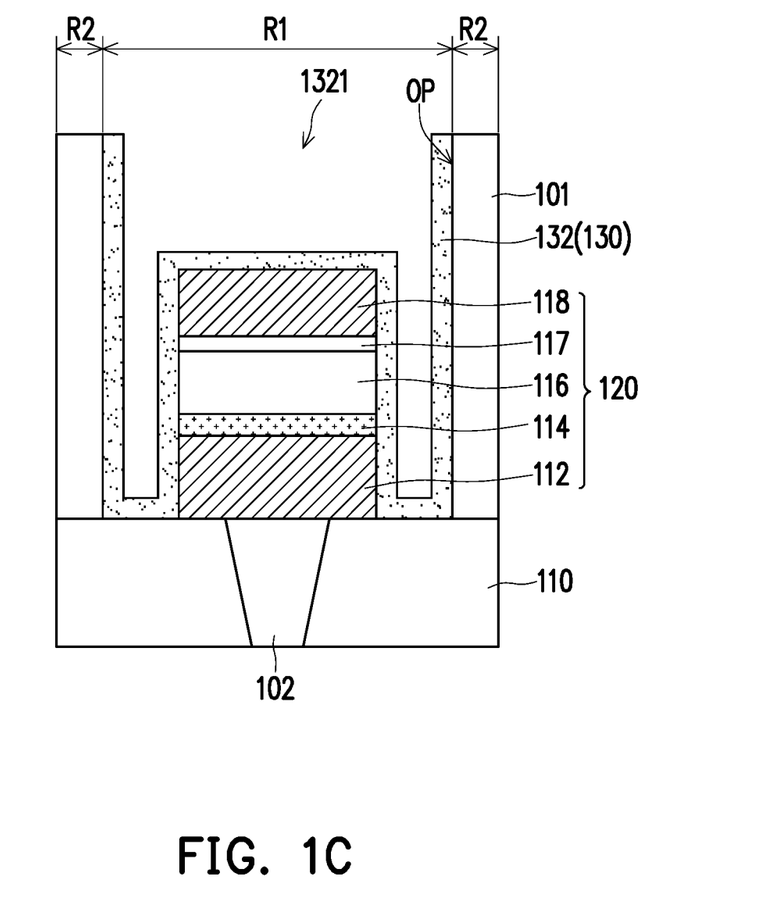

Referring to FIG. 1B and FIG. 1C together, after the insulation material 10 is formed, a portion of the insulation material 10 is removed to form an insulation layer 101 having an opening OP. Here, the insulation layer 101 may surround the stacked structure 120. For example, a portion of the first insulation material 12 and a portion of the second insulation material 14 are removed to form the insulation layer 101 having the opening OP.

In this embodiment, as shown in FIG. 1C, the substrate 110 includes a first region R1 and a second region R2 located on two sides of the first region R1. For example, a region exposed by the opening OP of the insulation layer 101 may be defined as the first region R1 of the substrate 110, and a region where the insulation layer 101 is located may be defined as the second region R2 of the substrate 110. Accordingly, film layers subsequently formed in the opening OP of the insulation layer 101 may only be located on the first region R1.

In an embodiment, in order to remove the portion of the insulation material 10 (the first insulation material 12 and the portion of the second insulation material 14) on the substrate 110 by an etching select ratio so as to form the insulation layer 101 having the opening OP, a material of the first insulation material 12 may be different from a material of the second insulation material 14. The material of the first insulation material 12 is, for example, silicon nitride or silicon oxynitride. The material of the second insulation material 14 is, for example, silicon dioxide. However, the invention is not limited in this regard. A method of removing the insulation material 10 may decided based on design requirements. A forming method of the first insulation material 12 and the second insulation material 14 may include chemical vapor deposition method.

Figure 1D:
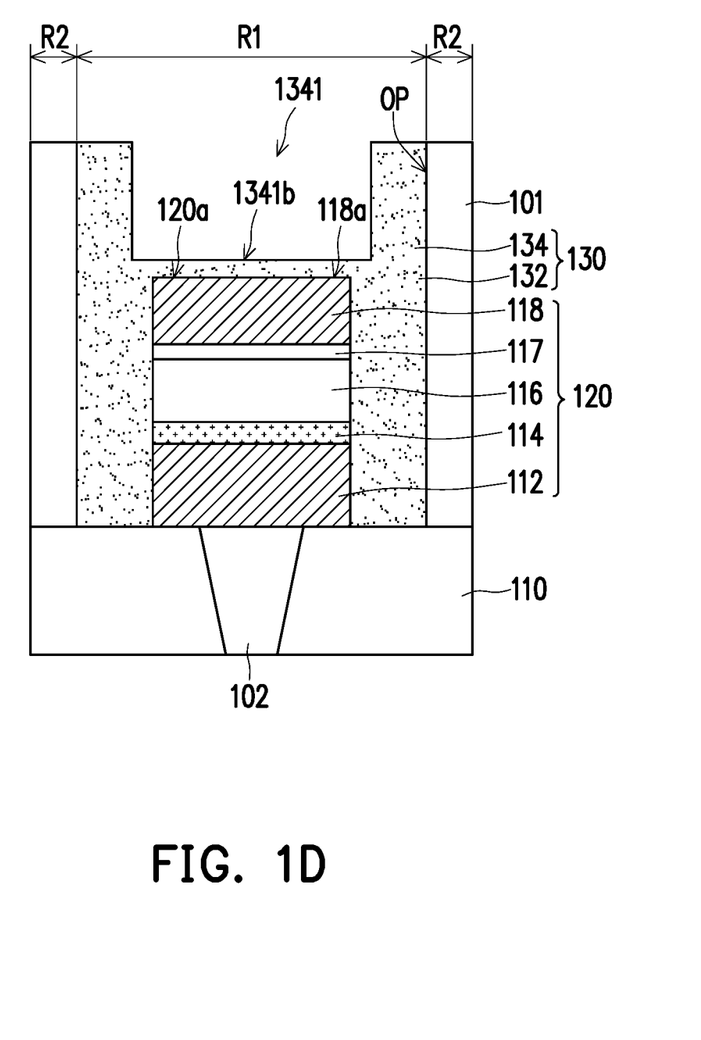

Referring to FIG. 1C and FIG. 1D together, after the insulation layer 101 having the opening OP is formed, a dielectric material 130 may be formed in the opening OP. The dielectric material 130 may be formed by the following steps. First, as shown in FIG. 1C, a first dielectric material 132 may be formed in the opening OP. Here, the first dielectric material 132 has a first groove 1321. The first dielectric material 132 is, for example, conformally formed on the opening OP so that the first dielectric material 132 has the first groove 1321. Next, as shown in FIG. 1D, a second dielectric material 134 is formed on the first dielectric material 132. Here, the second dielectric material 134 has a second groove 1341.

In an embodiment, a material of the first dielectric material 132 may be the same as a material of the second dielectric material 134. The material of the first dielectric material 132 is, for example, hafnium dioxide, aluminum oxide, or zirconium oxide. The material of the second dielectric material 134 is, for example, hafnium dioxide, aluminum oxide, or zirconium oxide, but the invention is not limited thereto. A forming method of the first dielectric material 132 and the second dielectric material 134 may include chemical vapor deposition method.

In an embodiment, as shown in FIG. 1D, the second groove 1341 may have a rectangular outline, but the invention is not limited thereto. In some embodiments not shown, the second groove 1341 may have a U-shaped outline or other suitable outline.

In this embodiment, a portion of the second dielectric material 134 may be sandwiched between the second groove 1341 and the stacked structure 120. For example, a bottom portion 1341b of the second groove 1341 may be at a distance from a top surface 120a of the stacked structure 120, so that a portion of the dielectric material 130 may be sandwiched between the bottom portion 1341b of the second groove 1341 and the top surface 120a of the stacked structure 120. Here, the top surface 120a of the stacked structure 120 may be a top surface 118a of the top electrode 118.

Figure 1E:
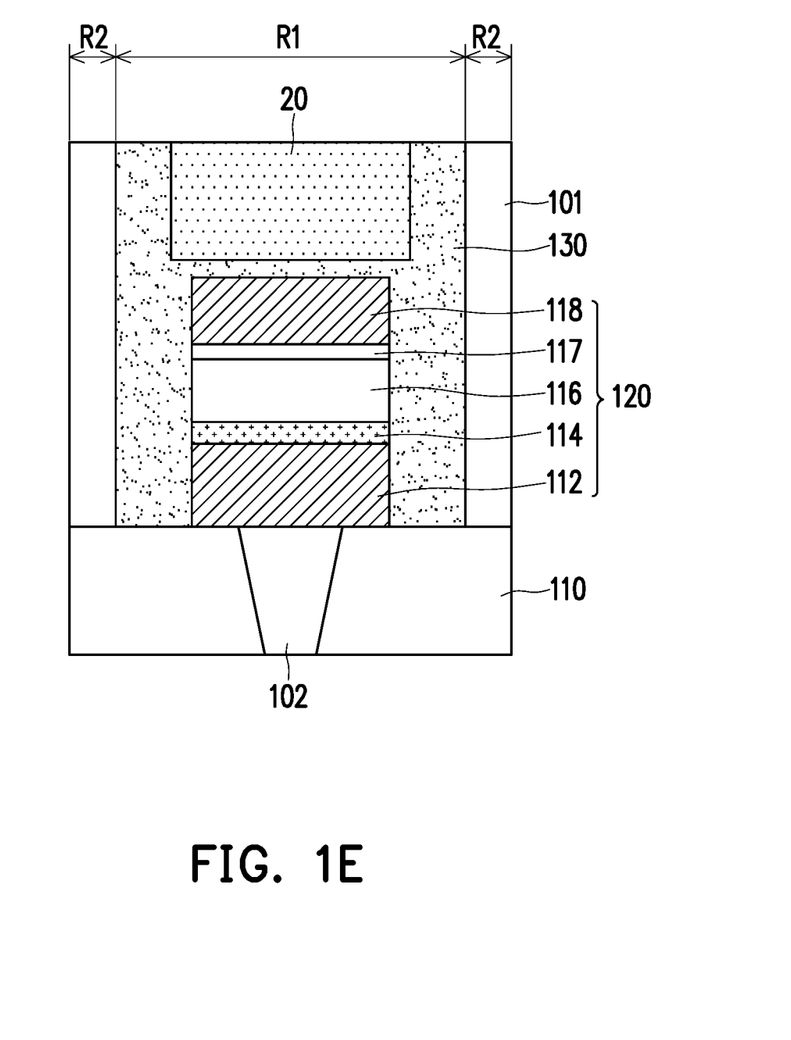

Referring to FIG. 1E, next, a mask material 20 may be formed in the second groove 1341. The mask material 20 is, for example, spin on carbon (SOC) or silicon dioxide, and a forming method thereof is, for example, chemical vapor deposition.

Figure 1F:
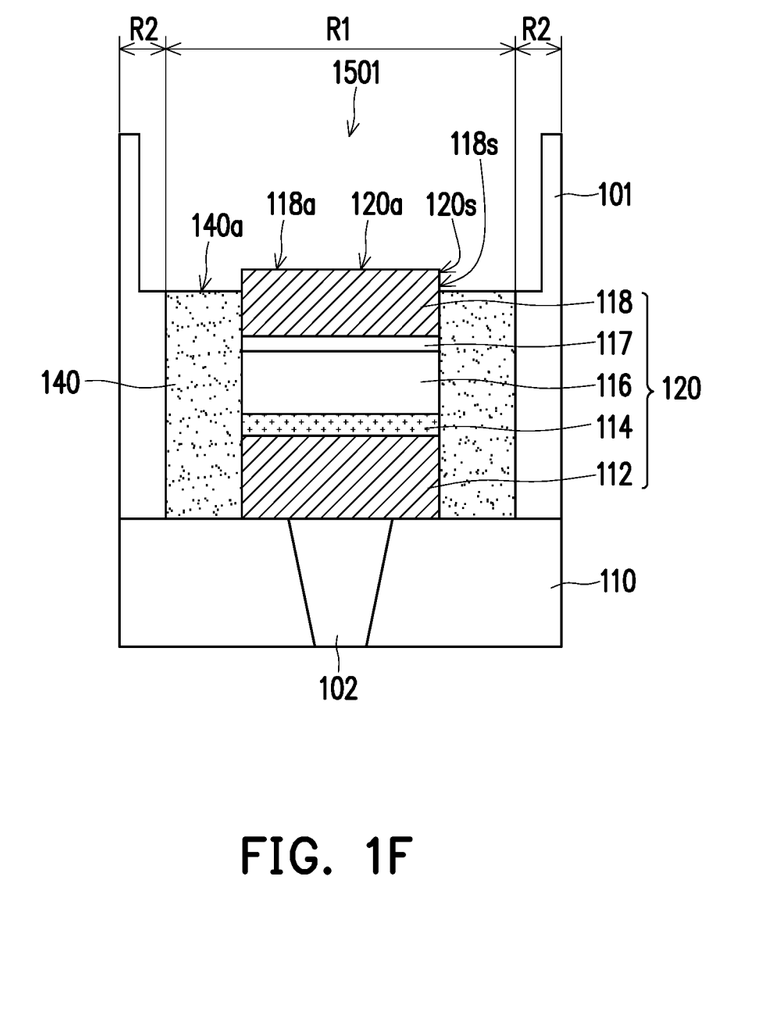

Referring to FIG. 1F, next, a portion of the insulation layer 101 and the dielectric material 130 are removed by using the mask material 20 to form a trench 1501 on the stacked structure 120. Here, a remaining portion of the dielectric material may form an encapsulating layer 140. In other words, by performing the patterning process on the insulation layer 101 and the dielectric material 130, the encapsulating layer 140 can be formed on a sidewall of the stacked structure 120 and the trench 1501 can extend from the first region R1 to the second region R2.

The dielectric material constituting the encapsulating layer 140 is a film layer (the first dielectric material 132 and the second dielectric material 134) formed in the opening OP of the insulation layer 101. Therefore, the encapsulating layer 140 may only be located on the first region R1, so as to solve the possible problem of RC delay caused by the encapsulating layer 140 extending to the second region R2, and effectively reduce wafer warpage caused by the encapsulating layer 140 extending to the second region R2. In addition, in an embodiment not shown, the first region R1 and the second region R2 shown in FIG. 1C may be a cell region in the resistive random access memory 100, and the encapsulating layer 140 does not extend to a peripheral region outside the cell region. Accordingly, wafer warpage can be further reduced, but the invention is not limited thereto.

In this embodiment, the trench 1501 may expose a portion of the stacked structure 120. For example, the trench 1501 may expose a portion of the top surface 120a of the stacked structure 120 and a portion of a sidewall 120s of the stacked structure 120 to increase an area of an electrical connection between a device subsequently formed in the trench 1501 and the stacked structure 120. For example, the trench 1501 may expose a portion of the top surface 118a of the top electrode 118 and a portion of a sidewall 118s of the top electrode 118 to increase the area of the electrical connection between the device subsequently formed in the trench 1501 and the top electrode 118.

In addition, the trench 1501 may also expose a portion of the encapsulating layer 140. For instance, the trench 1501 may also expose a top surface 140a of the encapsulating layer 140. In other words, the encapsulating layer 140 may cover a portion of the sidewall 120s of the stacked structure 120 close to the substrate 110, and expose another portion of the sidewall 120s of the stacked structure 120 away from the substrate 110. The encapsulating layer 140 covers, for example, a portion of the sidewall 118s of the top electrode 118 close to the substrate 110, and exposes another portion of the sidewall 118s of the top electrode 118 away from the substrate 110.

Figure 1G:
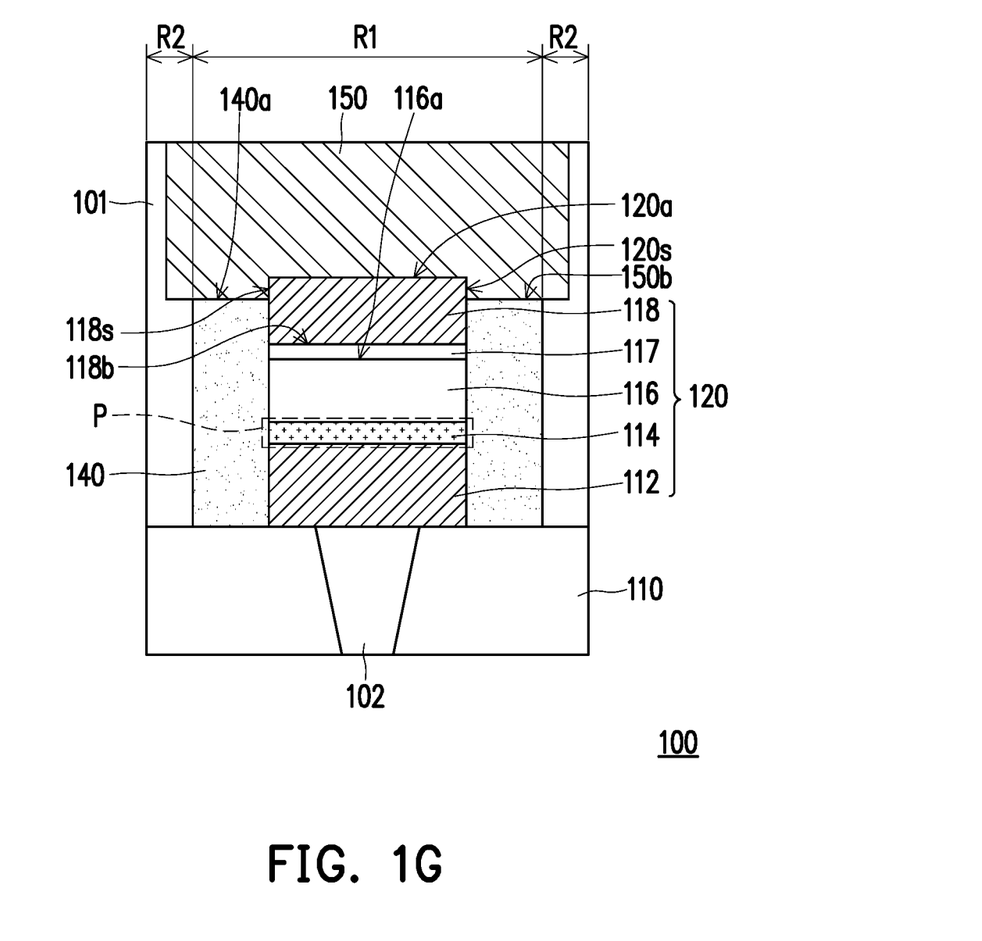

Referring to FIG. 1G, a bit line structure 150 is formed on the substrate 110. Here, the bit line structure 150 covers the top surface 120a of the stacked structure 120 and covers a portion of the sidewall 120s of the stacked structure 120, and the bit line structure 150 is electrically connected to the stacked structure 120. Therefore, an area of an electrical connection between the bit line structure 150 and the top electrode 118 can be increased so that the bit line structure 150 and the top electrode 118 are in direct contact to increase a contact window. Accordingly, the additional resistance value formed between the bit line structure 150 and the top electrode 118 by using other components is eliminated, so that better electrical performance can be effectively obtained during operation of the resistive random access memory 100 while meeting the trend of miniaturization.

Further, since the area of the electrical connection between the electrode and a conductive element will affect a size of a filament region, in this embodiment, with the bit line structure 150 covering the top surface 120a of the stacked structure 120 and covering the portion of the sidewall 120s of the stacked structure 120, an area P where filaments in the resistance random access memory 100 may be formed may be expanded, so that the filaments may be randomly formed within the area P to further improve the electrical performance of the resistance random access memory 100.

In addition, when the bit line structure in the resistive random access memory is electrically connected to the electrodes through a via, for example, an additional resistance value is formed in the resistive random access memory 100. Therefore, in this embodiment, the bit line structure 150 may cover a portion of the sidewall 118s of the top electrode 118. A bottom surface 150b of the bit line structure 150 may be higher than a bottom surface 118b of the top electrode 118, and the bit line structure 150 may be in direct contact with the top electrode 118. In other words, the via is not provided between the bit line structure 150 and the top electrode 118 to further ensure that the resistive random access memory 100 obtains better electrical performance during operation.

In this embodiment, the bit line structure 150 may be formed by forming a conductive material in the trench 1501, and the conductive material fills the trench 1501. Accordingly, the bit line structure 150 formed in the trench 1501 may increase its area of the electrical connection with the stacked structure 120. In addition, the bit line structure 150 in the trench 1501 may extend on the first region R1 and the second region R2. Here, an extending direction of the bit line structure 150 is perpendicular to a stacking direction of the stacked structure 120.

It should be noted that the invention does not limit a forming method of the bit line structure 150, and it falls in the scope of the invention for which protection is sought as long as the bit line structure 150 covers the top surface 120a of the stacked structure 120 and covers the portion of the sidewall 120s of the stacked structure 120.

On the other hand, the encapsulating layer 140 may be sandwiched between the bit line structure 150 and the substrate 110. The encapsulating layer 140 may cover another portion of the sidewall 120s of the stacked structure 120. For example, the bit line structure 150 may cover a portion of the sidewall 118s of the top electrode 118 away from the substrate 110, and the encapsulating layer 140 may cover another portion the sidewall 118s of the top electrode 118 close to the substrate 110.

In an embodiment, the top surface 140a of the encapsulating layer 140 may be higher than a top surface 116a of the oxygen exchanging layer 116 to prevent the problem that the resistance random access memory cannot be operated due to oxygen escape. The top surface 140a of the encapsulating layer 140 and the bottom surface 150b of the bit line structure 150 may be substantially coplanar.

In summary, because the bit line structure of the resistive random access memory of the invention covers the top surface of the stacked structure and covers a portion of the sidewall of the stacked structure, an area of an electrical connection between the bit line structure and the top electrode can be increased so that the bit line structure and the top electrode are in direct contact to increase a contact window. Accordingly, the additional resistance value formed by using other components is eliminated, so that better electrical performance can be effectively obtained during operation while meeting the trend of miniaturization. Furthermore, when the encapsulating layer is only located on the first region, the possible problem of RC delay caused by the encapsulating layer extending to the second region on the two sides may be solved, and wafer warpage caused by the encapsulating layer extending to the second region may also be effectively reduced.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A resistive random access memory, comprising:
a stacked structure, disposed on the substrate, wherein the stacked structure comprises:
    a bottom electrode, disposed on the substrate;
    a top electrode, disposed on the bottom electrode; and
    a resistance-switching layer, disposed between the bottom electrode and the top electrode;
a bit line structure, covering a top surface of the stacked structure and covering a portion of a sidewall of the stacked structure, wherein the bit line structure is electrically connected to the stacked structure; and
an encapsulating layer, disposed on the sidewall of the stacked structure,
wherein a top surface of the encapsulating layer and a bottom surface of the bit line structure are substantially coplanar.

2. The resistive random access memory of claim 1, wherein the bit line structure covers a portion of a sidewall of the top electrode, and the bit line structure is in direct contact with the top electrode.

3. The resistive random access memory of claim 1, wherein a via is not provided between the bit line structure and the top electrode.

4. The resistive random access memory of claim 1, wherein a bottom surface of the bit line structure is higher than a bottom surface of the top electrode.

5. The resistive random access memory of claim 1, wherein the encapsulating layer is sandwiched between the bit line structure and the substrate, and the encapsulating layer covers another portion of the sidewall of the stacked structure.

6. The resistive random access memory of claim 5, wherein the stacked structure further comprises an oxygen exchanging layer disposed between the resistance-switching layer and the top electrode.

7. The resistive random access memory of claim 6, wherein the top surface of the encapsulating layer is higher than a top surface of the oxygen exchanging layer.

8. The resistive random access memory of claim 1, wherein the substrate comprises a first region and a second region located on two sides of the first region, and the encapsulating layer is located only on the first region.

9. The resistive random access memory of claim 8, wherein the bit line structure extends on the first region and the second region, and an extending direction of the bit line structure is perpendicular to a stacking direction of the stacked structure.

10. A method of manufacturing a resistive random access memory, comprising:

forming a stacked structure on a substrate, wherein the stacked structure comprises a bottom electrode, a resistance-switching layer and a top electrode formed in that sequence;
forming an insulation layer on the substrate, the insulation layer having an opening;
forming a dielectric material in the opening;
removing a portion of the insulation layer and the dielectric material to form a trench on the stacked structure, wherein the trench exposes a top surface of the stacked structure and a portion of a sidewall of the stacked structure; and
forming a bit line structure in the trench, wherein the bit line structure is electrically connected to the stacked structure.

11. The method of manufacturing the resistive random access memory of claim 10, wherein the step of forming the bit line structure comprises:
forming a conductive material in the trench, the conductive material filling the trench.

12. The method of manufacturing the resistive random access memory of claim 10, wherein the step of Ruining the insulation layer comprises:
forming an insulation material on the substrate, the insulation material encapsulating the stacked structure;
removing a portion of the insulation material to from the opening.

13. The method of manufacturing the resistive random access memory of claim 12, wherein the step of forming the insulation material comprises:
forming a first insulation material on the substrate, wherein the first insulation material is stacked on the stacked structure;
forming a second insulation material on the substrate, the second insulation material encapsulating the stacked structure and the first insulation material.

14. The method of manufacturing the resistive random access memory of claim 10, wherein the step of forming the dielectric material comprises:
forming a first dielectric material in the opening, wherein the first dielectric material has a first groove; and
forming a second dielectric material on the first dielectric material, wherein the second dielectric material has a second groove.

15. The method of manufacturing the resistive random access memory of claim 14, wherein the first dielectric material is conformally formed on the opening so that the first dielectric material has the first groove.

16. The method of manufacturing the resistive random access memory of claim 14, wherein the step of forming the trench comprises:
forming a mask material in the second groove; and
removing the dielectric material by using the mask material.

17. The method of manufacturing the resistive random access memory of claim 14, wherein a portion of the second dielectric material is sandwiched between the second groove and the stacked structure.

18. The method of manufacturing the resistive random access memory of claim 10, wherein after the portion of the insulation layer and the dielectric material are removed, a remaining portion of the dielectric material forms an encapsulating layer, and the encapsulating layer is located on the sidewall of the stacked structure and sandwiched between the bit line structure and the substrate.

19. The method of manufacturing the resistive random access memory of claim 18, wherein the step of forming the stacked structure comprises: forming an oxygen exchanging layer between the resistance-switching layer and the top electrode, a top surface of the encapsulating layer being higher than a top surface of the oxygen exchanging layer.

\* \* \* \* \*